United States Patent
Yen et al.

(10) Patent No.: US 12,046,494 B2
(45) Date of Patent: Jul. 23, 2024

(54) CHIP MATCHING SYSTEM AND METHOD THEREOF

(71) Applicant: SILICONWARE PRECISION INDUSTRIES CO., LTD., Taichung (TW)

(72) Inventors: Wu-Hung Yen, Taichung (TW); Yi-Hsien Huang, Taichung (TW); Chun-Tang Lin, Taichung (TW); Shu-Hua Chen, Taichung (TW); Shou-Qi Chang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 17/988,286

(22) Filed: Nov. 16, 2022

(65) Prior Publication Data
US 2023/0076941 A1    Mar. 9, 2023

Related U.S. Application Data

(62) Division of application No. 17/073,783, filed on Oct. 19, 2020, now Pat. No. 11,532,495.

(30) Foreign Application Priority Data
Aug. 14, 2020   (TW) ................. 109127748

(51) Int. Cl.
*H01L 21/67*   (2006.01)
(52) U.S. Cl.
CPC .. *H01L 21/67271* (2013.01); *H01L 21/67144* (2013.01)

(58) Field of Classification Search
CPC ......... H01L 21/67271; H01L 21/67144; H01L 21/67276
See application file for complete search history.

(56) References Cited

U.S. PATENT DOCUMENTS

| | | | |
|---|---|---|---|
| 6,746,879 B1 * | 6/2004 | Chen ................. | H01L 21/67271 700/121 |
| 2001/0047496 A1 * | 11/2001 | Hidaka ................. | G11C 29/48 714/5.1 |
| 2005/0130333 A1 * | 6/2005 | Zhong ............... | H01L 21/67271 382/145 |

(Continued)

FOREIGN PATENT DOCUMENTS

| | | | | |
|---|---|---|---|---|
| CN | 104380465 A | * | 2/2015 | ........... H01L 25/042 |
| WO | WO-2011125115 A1 | * | 10/2011 | ......... G01R 31/2893 |

*Primary Examiner* — Mohammed Shamsuzzaman
(74) *Attorney, Agent, or Firm* — Studebaker & Brackett PC

(57) ABSTRACT

A chip matching system and a corresponding method are provided. The method defines a plurality of first electronic components in a first wafer as various grades of chips and defines a plurality of second electronic components in a second wafer as various grades of chips, and then grades of the first electronic components and the second electronic components are matched to generate target information, and finally the first and second electronic components are integrated in the same position according to the target information. Therefore, the highest-grade chips can be arranged in a multi-chip module to optimize the quality of the multi-chip module.

5 Claims, 14 Drawing Sheets

(56) References Cited

U.S. PATENT DOCUMENTS

| | | | |
|---|---|---|---|
| 2014/0002128 A1* | 1/2014 | Ohmart | H01L 22/30 |
| | | | 324/762.03 |
| 2019/0228986 A1* | 7/2019 | Li | H01L 21/52 |
| 2020/0357951 A1* | 11/2020 | Park | H01L 33/0095 |
| 2021/0134640 A1* | 5/2021 | Sreenivasan | G06F 30/392 |
| 2021/0350061 A1* | 11/2021 | Sreenivasan | H01L 21/6835 |

* cited by examiner

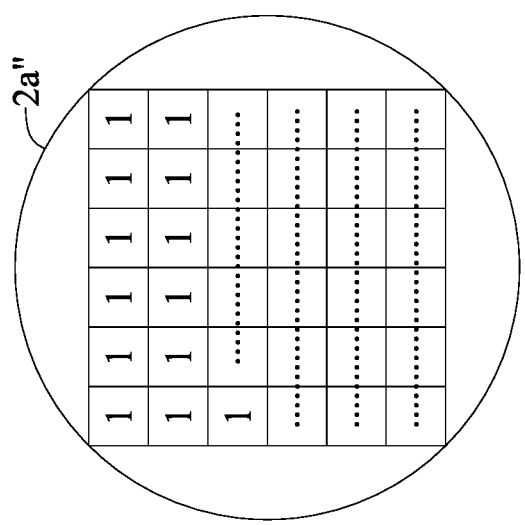
FIG. 4"

CHIP MATCHING SYSTEM AND METHOD THEREOF

This is a divisional of co-pending U.S. Ser. No. 17/073,783, filed Oct. 19, 2020, which claims priority to Taiwan Application Serial No. 109127748, filed Aug. 14, 2020.

BACKGROUND

1. Technical Field

The present disclosure relates to a packaging process. In particular, the present disclosure relates to a chip matching system and a chip matching method applied in a multi-chip module packaging process.

2. Description of Related Art

In the conventional semiconductor manufacturing process, after the wafer is manufactured, it undergoes processes such as thinning, packaging, and singulation. In each process, a carrier board (such as a package substrate, a temporary glass carrier or another carrier, etc.) is required to carry the wafer or chips.

On the production line, the defective chips must be eliminated first, and then the good chips must be rearranged on the carrier board. As shown in FIG. 1, first, conduct quality inspection on wafer 1a to determine chips to be accepted and defective chips X to be rejected, and then classify the quality of each good chip based on functionality performance to define chips 1 of the first grade, chips 7 of the second grade, chips 8 of the third grade and chips 9 of the fourth grade in order of functionality performance. Among them, the chips of the first grade have the best functionality performance and the chips of the fourth grade have the worst functionality performance. Afterwards, according to an S-shaped continuous winding path L, the good chips (the first-grade chips 1, the second-grade chips 7, the third-grade chips 8 and the fourth-grade chips 9) are picked one by one onto the carrier board, and then a subsequent packaging operation is performed.

The early package structure usually only needs a single chip to meet the functional requirements, so only one chip packaging process (such as flip chip process or wire bonding process) is required on the production line.

However, due to the development of multi-functions and the demand for high-frequency and high-speed computing, the demand for products has moved towards the development of multi-chip modules (MCM).

As shown in FIG. 1', the conventional multi-chip module 1' requires bonding a plurality of chips 11, 12 onto a package substrate 10 through a plurality of solder bumps 13, and then the packaging material 14 covering the plurality of chips 11, 12 is formed, and then a ball placement process or another process can be performed. Therefore, on the production line, it is necessary to dispose multiple chips 11, 12 on a single package substrate 10. In other words, multiple chip picking and placing processes are required on the production line.

However, on the production line, the chips 11 and 12 are obtained from different wafers, and the grade status (such as position, quantity, etc.) of the chips 11 and 12 of each wafer is inconsistent. Therefore, if the good chips (the first-grade chips 1, the second-grade chips 7, the third-grade chips 8, and the fourth-grade chips 9) are picked one by one onto the carrier board (such as the package substrate 10) according to the S-shaped continuous winding path L, the grade of each chip 11, 12 in a single multi-chip module 1' cannot be controlled. As a result, the functional status of each multi-chip module 1' cannot be controlled. Therefore, subsequent quality control operations need to eliminate a large number of multi-chip modules 1' with poor functional status (for example, all or most of the chips 11 and 12 are fourth-grade chips 9).

Therefore, how to overcome the shortcomings of the above-mentioned conventional technologies has become an urgent problem to be solved at present.

SUMMARY

To solve the above problems, the present disclosure provides a chip matching system, including: a first picking device configured for moving a plurality of first electronic components of different grades defined by a first wafer; a second picking device configured for moving a plurality of second electronic components of different grades defined by a second wafer; and a calculation module communicatively connected to the first picking device and the second picking device to perform a grade matching between the first electronic components and the second electronic components to generate target information, wherein the first picking device and the second picking device integrate at least one of the first electronic components and at least one of the second electronic components in one position based on the target information.

In the chip matching system, the first picking device transmits first status information to the calculation module, and the second picking device transmits second status information to the calculation module, such that the calculation module performs the grade matching according to the first status information and the second status information to generate the target information, wherein the first status information includes grades of the plurality of first electronic components, and the second status information includes grades of the plurality of second electronic components.

The present disclosure further provides a chip matching method, including: defining a plurality of first electronic components and a plurality of second electronic components of different grades in a first wafer and a second wafer, respectively; performing a grade matching between the plurality of first electronic components and the plurality of second electronic components to generate target information; and integrating at least one of the first electronic components and at least one of the second electronic components in one position based on the target information.

In the aforementioned chip matching system and method, the plurality of first electronic components are classified into at least three grades.

In the aforementioned chip matching system and method, the plurality of second electronic components are classified into at least three grades.

In the aforementioned chip matching system and method, the calculation module is configured for matching the first electronic components of a highest grade to the second electronic components of a highest grade in a same position. For example, a number of matched pairs of the first electronic components and the second electronic components of the highest grade is maximized.

It can be seen from the above that in the chip matching system and method of the present disclosure, the calculation module performs the grade matching between the first electronic components and the second electronic components to generate the target information, so that the first electronic components and the second electronic components of higher grades can be integrated in the same position according to the target information. Therefore, compared to the conventional technology, the present disclosure can match the qualities of chips of each grade of different wafers according to quality requirements of the multi-chip modules to achieve high-efficiency chip quality matching operation, optimize the quality of the multi-chip modules and increase the productivity and efficiency of the production line.

BRIEF DESCRIPTION OF THE DRAWINGS

FIG. 1' is a three-dimensional schematic diagram of a conventional multi-chip module.

FIG. 2A' is a schematic cross-sectional view of an electronic package manufactured by a production line of the chip matching system of the present disclosure.

FIG. 2B' is a schematic top plane view of the carrier board used in the production line of the chip matching system of the present disclosure.

FIG. 3' is a schematic diagram of the flow in FIG. 3.

FIG. 4' is a schematic diagram of the flow in FIG. 4.

FIG. 4" is a schematic top plane view of the carrier board in FIG. 4.

DETAILED DESCRIPTION

Figure 1:
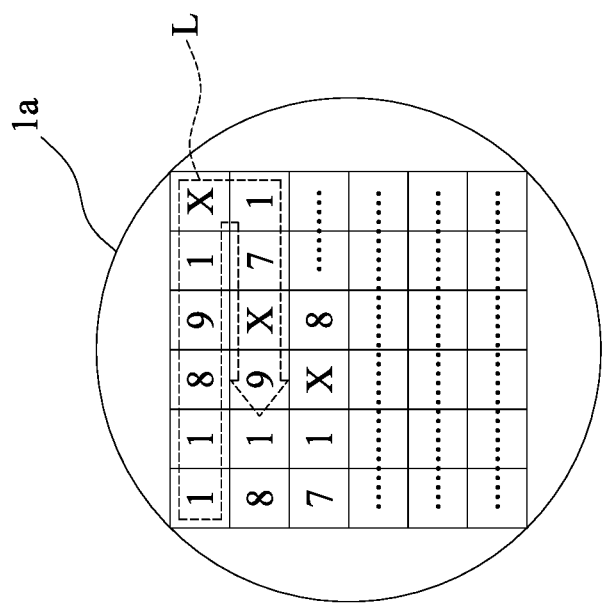
FIG. 1 is a schematic top plane view of a conventional wafer.
Figure 1:
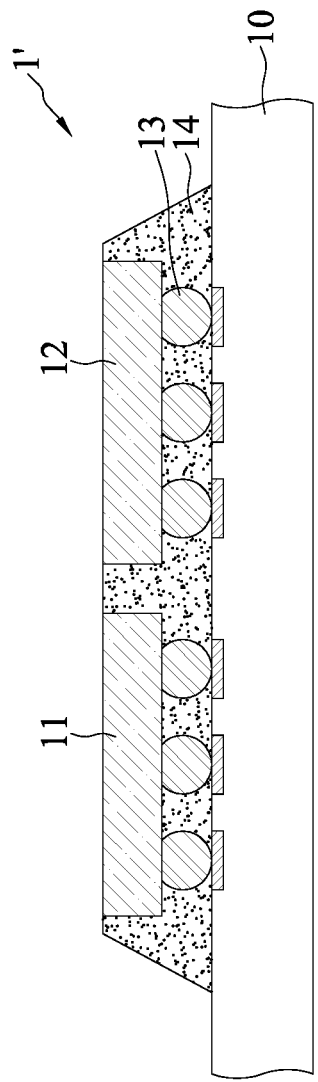

The following describes the implementation of the present disclosure with specific embodiments. Persons having ordinary skills in the art can easily understand the other advantages and effects of the present disclosure based on the content disclosed in this specification.

Please note that the structure, ratio, size, etc., shown in the drawings accompanying this specification are used to illustrate the contents disclosed in the specification for the understanding and reading of persons familiar with the art, and are not used to limit the present disclosure. Therefore, the aforementioned structure, ratio, size, etc., do not have technical significance. Any structural modification, change of proportional relationship, or size adjustment should still fall within the scope that can be covered by the technical contents disclosed by the present disclosure as long as the goals achievable by the present disclosure and the effects that can be generated by the present disclosure are not affected. Meanwhile, the terms such as "on," "first," "second," "third," "fourth" and "a" used in this specification are for ease of description, not for limiting the implementable scope of the present disclosure. The change or adjustment of the relationship thereof shall be regarded as the implementable scope of the present disclosure as long as there is no substantial change to the technical contents.

Figure 2A:
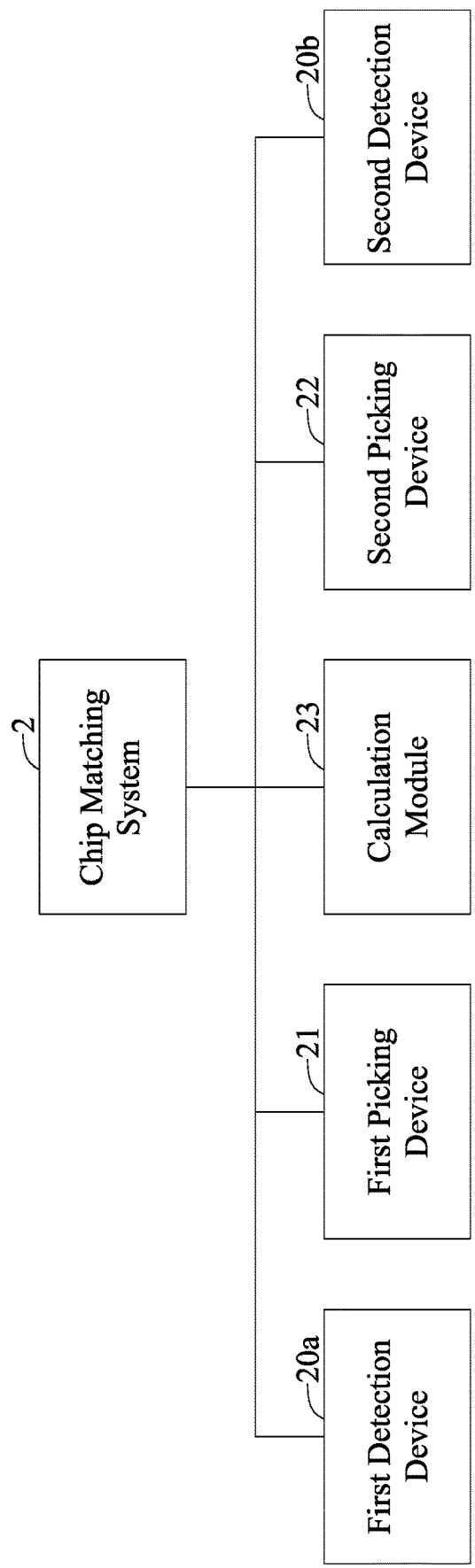
FIG. 2A is a schematic diagram of the architectural configuration of the chip matching system of the present disclosure.
Figure 2A:
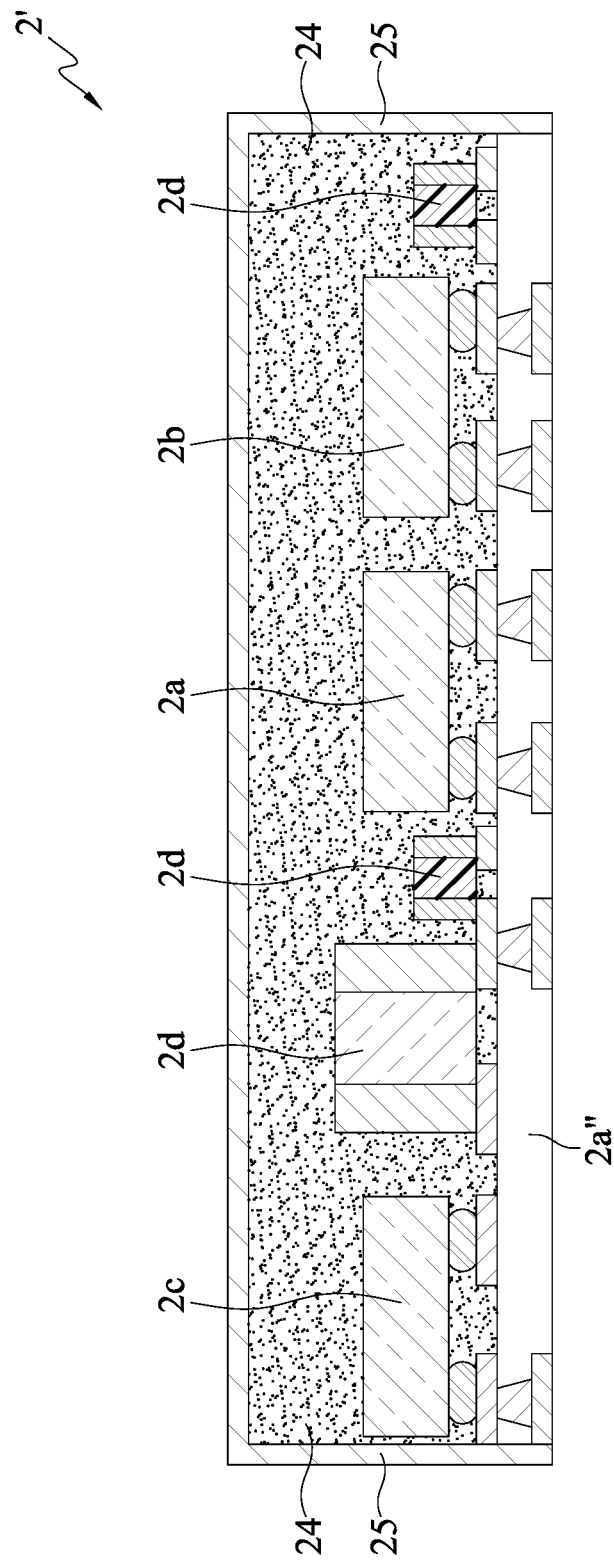

FIG. 2A is a schematic diagram of the architecture configuration of the chip matching system 2 of the present disclosure. As shown in FIG. 2A, the chip matching system 2 includes a first detection device 20a, a first picking device 21, a second detection device 20b, a second picking device 22, and a calculation module 23 communicably connected to the first picking device 21, the second picking device 22, the first detection device 20a and the second detection device 20b.

In an embodiment, the chip matching system 2 disposes a plurality of electronic components on a carrier board 2a", as shown in FIG. 2A', to perform the packaging process to obtain the required electronic package 2'. For example, in the electronic package 2', the electronic components are covered by the package layer 24, and a metal layer 25 can be formed on the package layer 24 as required.

The carrier board 2a" is a circuit structure with a core layer or without a core layer (coreless), such as a package substrate. It should be understood that the carrier board 2a" can also be another component for carrying other electronic components (such as chips), such as a lead frame, a silicon interposer, or consumable temporary carrier board, which is not limited thereto.

The electronic components include a first electronic component 2a, a second electronic component 2b, a third electronic component 2c and a plurality of fourth electronic components 2d, which are disposed on the carrier board 2a" and are electrically connected to the carrier board 2a", wherein, the first electronic component 2a, the second electronic component 2b, and the third electronic component 2c are semiconductor chips, and the fourth electronic components 2d are passive components such as resistors, capacitors, or inductors. For example, the first electronic component 2a, the second electronic component 2b, and the third electronic component 2c are disposed on the carrier board 2a" in a flip chip manner through a plurality of conductive bumps such as solder material and are electrically connected to the carrier board 2a". Alternatively, the first electronic component 2a, the second electronic component 2b, and the third electronic component 2c can also be disposed on the carrier board 2a" in a wire bonding manner through a plurality of bonding wires (not shown) and electrically connected to the carrier board 2a". However, the configuration of the electronic components is not limited to the above.

The package layer 24 is formed on the carrier board 2a" and covers each of the electronic components, wherein the material forming the package layer 24 is an insulating material such as polyimide (PI), dry film, epoxy or molding compound, but not limited to the above.

The metal layer 25 is formed on the external surface of the package layer 24 for shielding purposes. The material of the metal layer 25 is selected from copper (Cu), nickel (Ni), iron (Fe), aluminum (Al) or stainless steel (Sus). For example, the metal layer 25 is formed by electroplating, chemical plating, physical vapor deposition, sputtering, or other appropriate methods.

The first detection device 20a is configured for detecting the electronic components. The first picking device 21 is configured for moving the electronic components, and has functions such as picking and rearranging the electronic components, etc. The first picking device 21 can be configured with related equipment (such as robotic arms, conveyor belts, etc.) according to the functions.

Figure 2B:
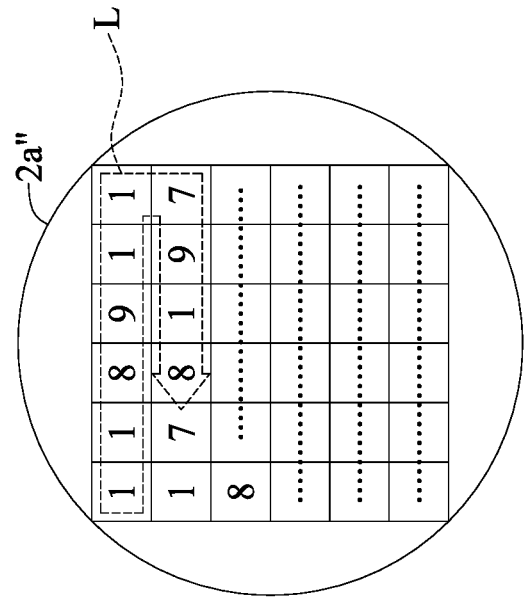
FIG. 2B is a schematic top plane view of the first wafer used in the production line of the chip matching system of the present disclosure.
Figure 2B:
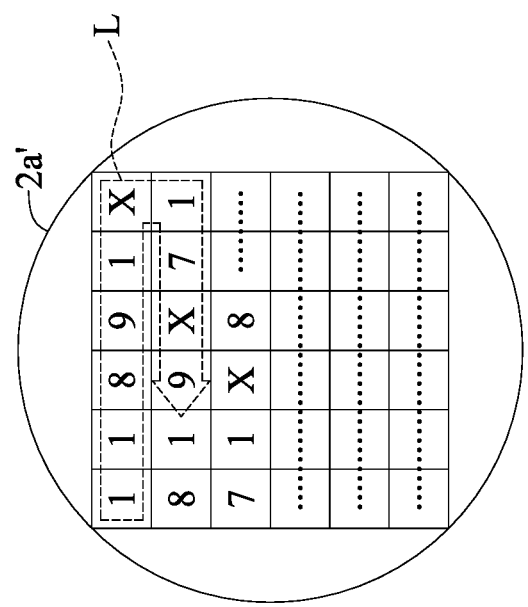

In an embodiment, the first detection device 20a transmits the result information of detecting the electronic components to the first picking device 21 via the calculation module 23, so that the first picking device 21 can move the first electronic component 2a. For example, the first detection device 20a performs quality inspection on each chip defined in the first wafer 2a', as shown in FIG. 2B, to determine good chips to be accepted and defective chips X to be rejected, and then classifies the quality of functionality performance of each of the good chips to define the first-grade chips 1, the second-grade chips 7, the third-grade chips 8, and the fourth-grade chips 9 according to the functionality performance. Among them, the first grade has the best functionality performance, whereas the fourth grade has the worst functionality performance. Specifically, the good chips (the first-grade chips 1, the second-grade chips 7, the third-grade chips 8, and the fourth-grade chips 9) in the first wafer 2a' are used as the first electronic components 2a.

Furthermore, the first picking device 21 picks the good chips (the first-grade chips 1, the second-grade chips 7, the third-grade chips 8, and the fourth-grade chips 9) one by one according to an S-shaped continuous winding (such as snaking) path L onto the carrier board 2a" (for example, a temporary glass carrier or package substrate), as shown in FIG. 2B'. In other words, the defective chips X are eliminated to rearrange the good chips (such as sequentially filling the positions of the defective chips X), so as to rearrange the good chips in an array on the carrier board 2a".

The second detection device 20b is configured to detect the electronic components. The second picking device 22 is configured to move the electronic components, and has functions such as picking and rearranging the electronic components, etc. The second picking device 22 can be configured with related equipment (such as robotic arms, conveyor belts, etc.) according to the functions.

Figure 2D:
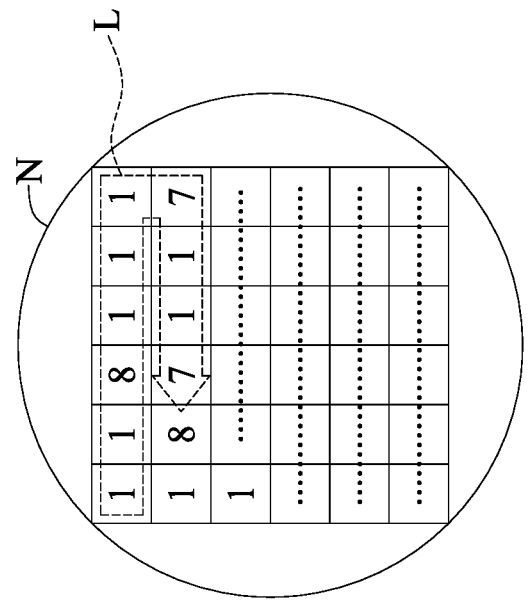
FIGS. 2D and 2D' are a diagram and a table of target information generated by the calculation module of the chip matching system of the present disclosure.
Figure 2C:
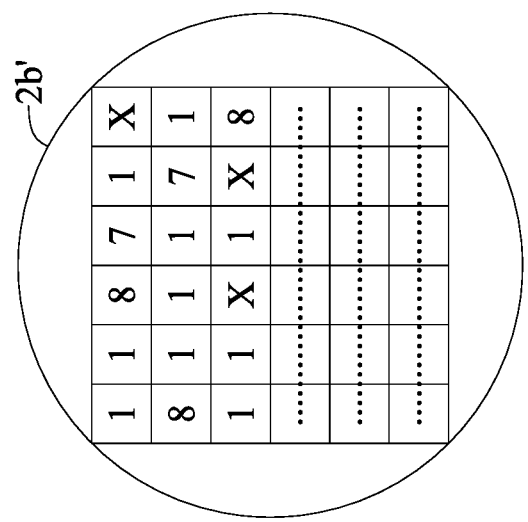
FIG. 2C is a schematic top plane view of the second wafer used in the production line of the chip matching system of the present disclosure.
Figure 2D:
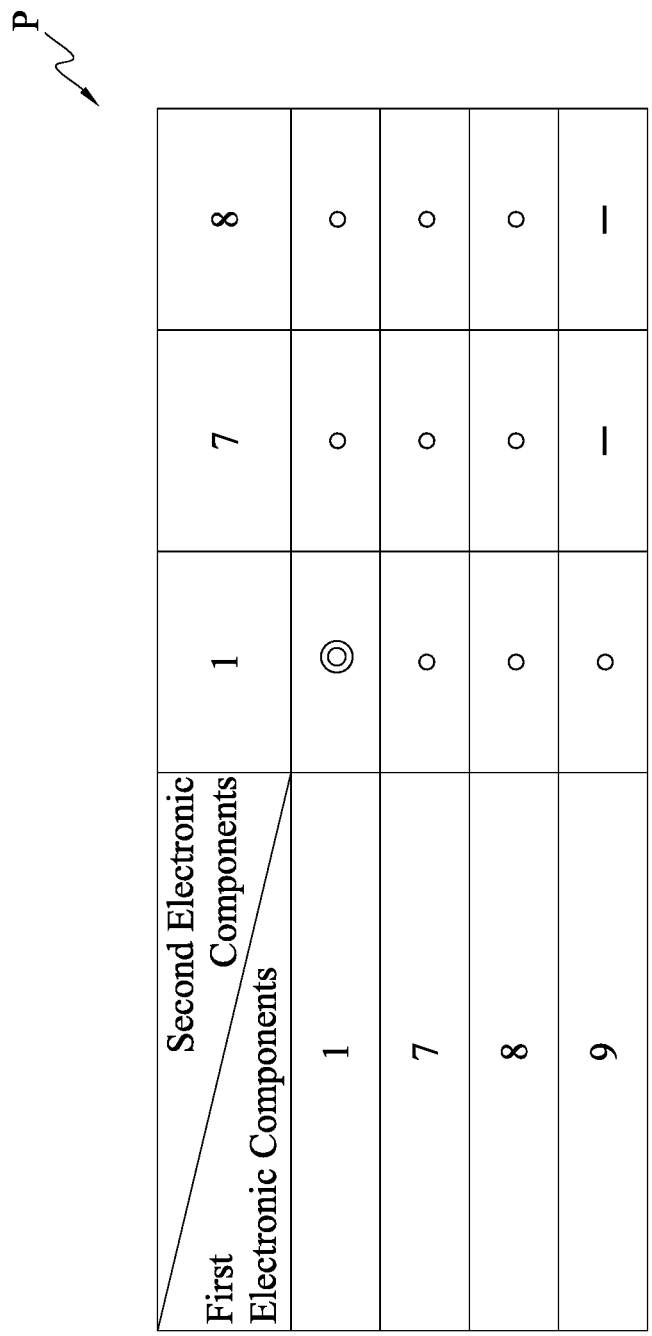

In an embodiment, the second detection device 20b transmits the result information of detecting the electronic components to the second picking device 22 via the calculation module 23, so that the second picking device 22 can move the second electronic component 2b. For example, the second detection device 20b performs quality inspection on each chip defined in the second wafer 2b', as shown in FIG. 2C, to determine good chips to be accepted and defective chips X to be rejected, and then classifies the quality of functionality performance of each of the good chips to define the first-grade chips 1, the second-grade chips 7 and the third-grade chips 8 according to the functionality performance. Among them, the first grade has the best functionality performance, whereas the third grade has the worst functionality performance. Specifically, the good chips (the first-grade chips 1, the second-grade chips 7 and the third-grade chips 8) in the second wafer 2b' are used as the second electronic components 2b. It should be understood that the good chips in the second wafer 2b' can also be classified into the first-grade chips 1, the second-grade chips 7, the third-grade chips 8 and the fourth-grade chips 9.

The calculation module 23 is configured for performing the grade matching between the first electronic components 2a and the second electronic components 2b.

Figure 3:
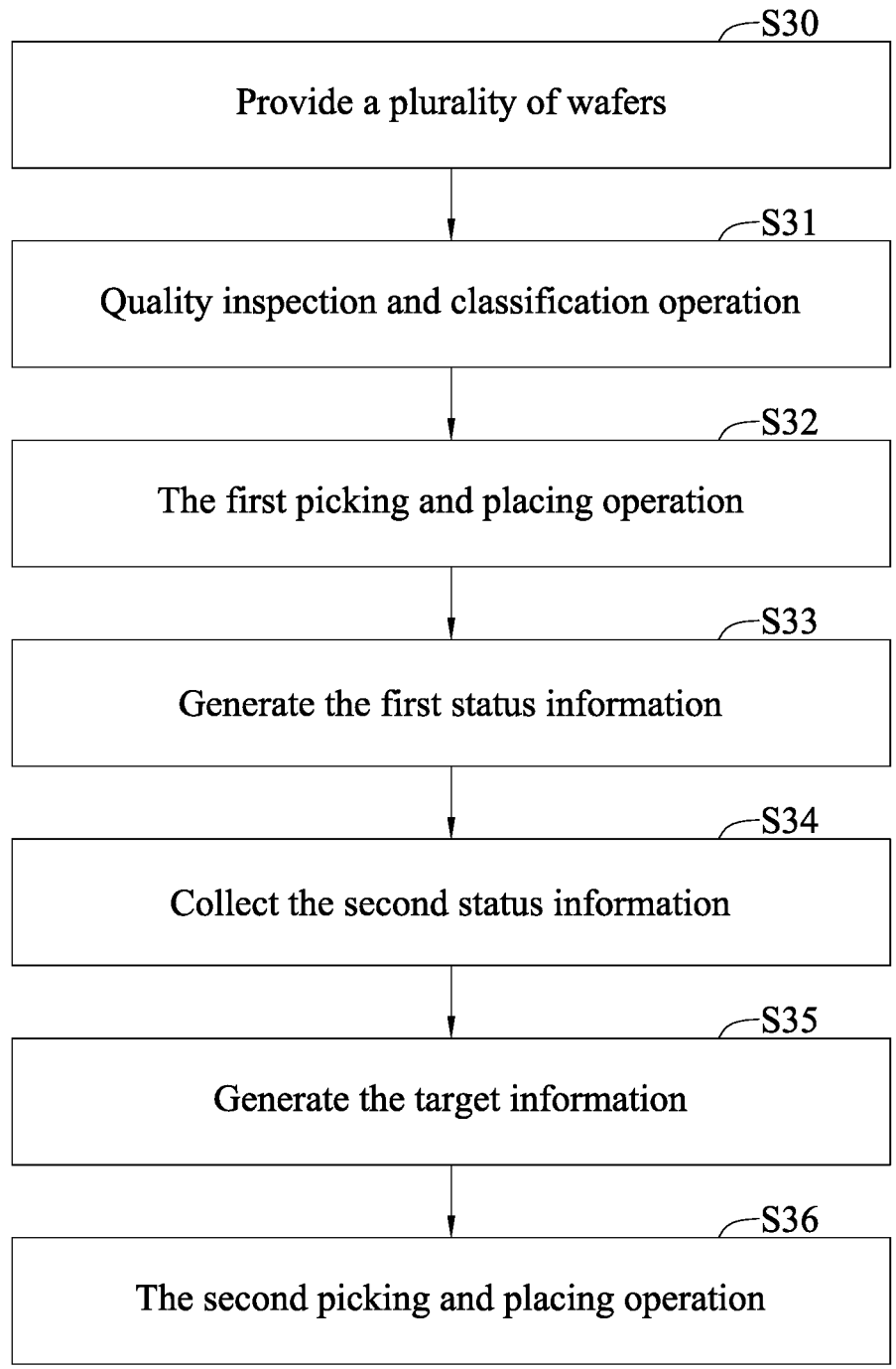
FIG. 3 is a flow block diagram of the first embodiment of a chip matching method of the present disclosure.
Figure 3:
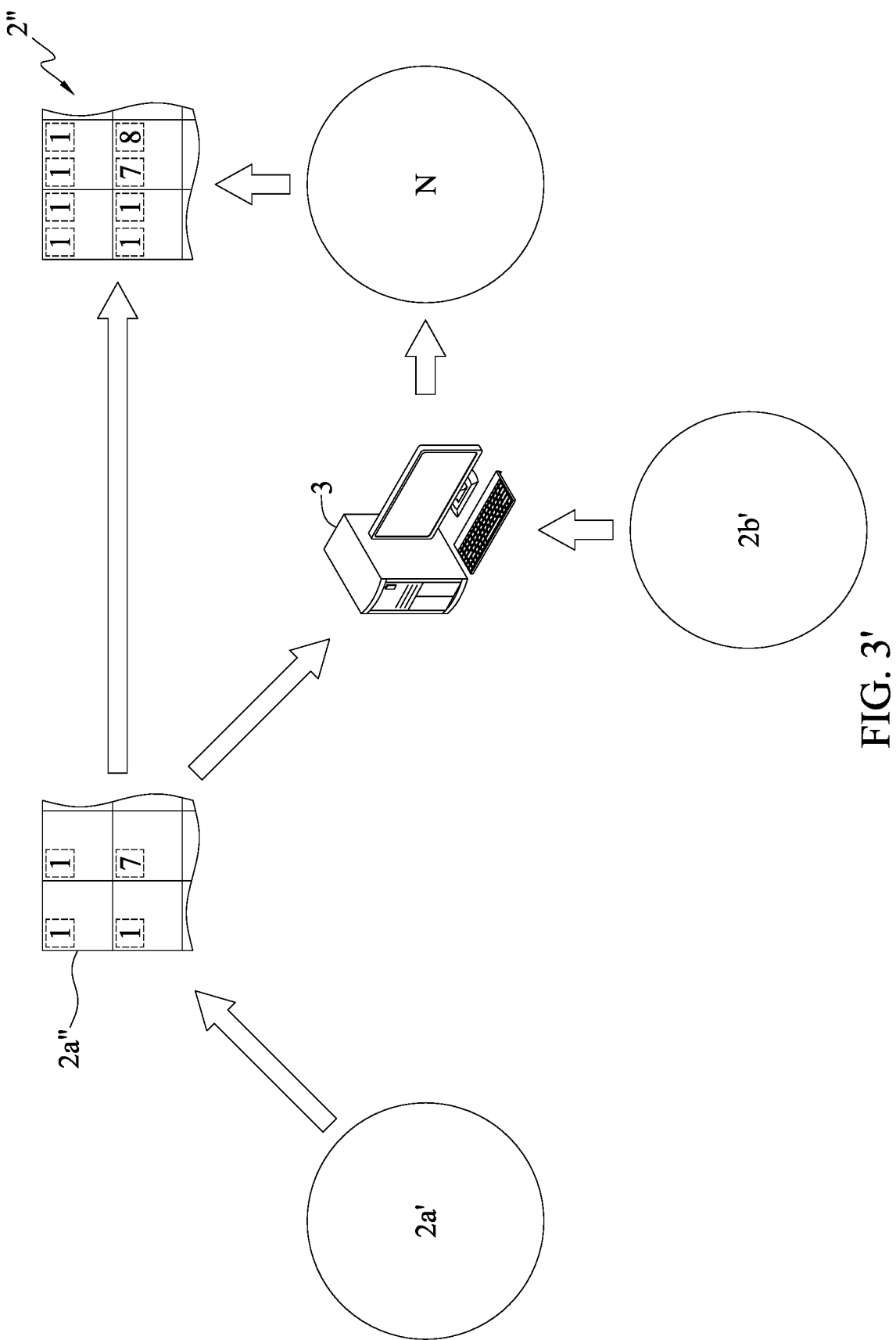

In an embodiment, the calculation module 23 operates in an electronic device 3 (as shown in FIG. 3'), such as a computer, server, cloud, or other computing equipment, to perform data transmission to and/or from the first picking device 21 and the second picking device 22 through wired or wireless connections. For example, the calculation module 23 matches the first electronic components 2a and the second electronic components 2b on the carrier board 2a" according to grade status of the chips (the first grade, the second grade, the third grade, and the fourth grade). Specifically, the first picking device 21 generates the first status information based on the result of processing the chips (such as the arrangement status on the carrier board 2a" as shown in FIG. 2B') and transmits the first status information to the calculation module 23, and the second picking device 22 transmits the second status information based on the second wafer 2b' on which a quality classification has been performed (as shown in FIG. 2C) to the calculation module 23, so that the calculation module 23 can perform optimization matching based on the first status information and the second status information to obtain the target information, which includes a virtual array N shown in FIG. 2D and a chip pairing combination P shown in FIG. 2D'. It should be understood that the first status information and the second status information include the grades, positions, quantities, and other parameters of the good chips (such as the first electronic components 2a and the second electronic components 2b).

Furthermore, the chip pairing combination P includes the matching statuses of chips of various grades. For example, a first-grade chip 1 of the first wafer 2a' can be matched to a first-grade chip 1 of the second wafer 2b' in the same electronic package 2' (the pattern "⊙" shown in FIG. 2D'), and the other matching statuses that can be used are represented by a "○" pattern; the matching statuses of a fourth-grade chip 9 of the first wafer 2a' with a second-grade chip 7 or a third-grade chip 8 of the second wafer 2b' are excluded (as shown in FIG. 2D', the "-" patterns indicate matching statuses that are not used).

In addition, the virtual array N is generated by rearranging the good chips of the second wafer 2b' (the second status information) according to the matching statuses of the chip pairing combination P, that is, according to the matching statuses that can be used in the chip pairing combination P (such as the "⊙" pattern and the "○" patterns shown in FIG. 2D'), and the unused matching statuses of the chip pairing combination P (such as the "-" patterns shown in FIG. 2D') should be excluded. For example, the chips of each grade provided by the second status information proceed through a position reassignment operation based on the chips of each grade of the corresponding first status information, so that the positions of the chips of each grade in the virtual array N correspond to (or align with) the positions of the chips of each grade on the carrier board 2a" (as shown in FIG. 2B'). Specifically, during the picking process, the second picking device 22 can pick chips of required grades from the second wafer 2b' according to the order along the continuous winding path L in the virtual array N to the carrier board 2a" (which has been configured with the first electronic components 2a) corresponding to the production line. It should be understood that due to the on-site machine configuration of the production line, for the smoothness of the picking operation of the second picking device 22 (for example, considering the shortest operation path of the robotic arm), the picking order of the second picking device 22 for the virtual array N is not limited to the aforementioned continuous winding path L.

Therefore, the second picking device 22 picks the required good chips (the first-grade chips 1, the second-grade chips 7 and the third-grade chips 8 as shown in FIG. 2C) on the second wafer 2b' according to the target information of the calculation module 23 onto the carrier board 2a" to optimize the functionality performance of the electronic package 2'. It should be understood that in a single electronic package 2', if the first electronic component 2a and the second electronic component 2b are both chips 1 of the first grade, the functionality performance is the best. Therefore, the target information has to present the maximized number of matched pairs of the first-grade chips 1 of the two wafers. For example, the positions of the first-grade chips 1 presented by the virtual array N should correspond to those of the first-grade chips 1, namely the first electronic components 2a, on the carrier board 2a as much as possible, so that the production line can produce the maximum number of the electronic packages 2' with multiple electronic components of the highest grade (such as two chips 1 of the first grade), such as the full-surface package structure 2" shown in FIG. 2E.

FIG. 3 is a schematic block diagram of the flow of the first embodiment of the chip matching method of the present disclosure. In an embodiment, the chip matching system 2 is used to execute the chip matching method, as shown in FIG. 3'.

In step S30, a plurality of wafers are provided in a production line for manufacturing electronic packages 2' as shown in FIG. 2A'. In an embodiment, the plurality of wafers are the first wafer 2a' and the second wafer 2b', respectively.

In step S31, the quality inspection and classification operation of the first wafer 2a' and the second wafer 2b' are performed by the first detection device 20a and the second detection device 20b.

In an embodiment, the first detection device 20a performs quality inspection on each chip defined in the first wafer 2a' to determine good chips and defective chips X, and then performs quality classification of functionality performance of each good chip to define the first-grade chips 1, the second-grade chips 7, the third-grade chips 8 and the fourth-grade chips 9, as shown in FIG. 2B and FIG. 3'.

Moreover, the second detection device 20b performs quality inspection on each chip defined in the second wafer 2b' to determine good chips and defective chips X, and then performs quality classification of functionality performance of each good chip to define the first-grade chips 1, the second-grade chips 7 and the third-grade chips 8, as shown in FIG. 2C and FIG. 3'.

In step S32, the first picking device 21 is used to perform the first picking and placing (rearrangement) operation.

In an embodiment, the first picking device 21 rearranges the good chips (the first-grade chips 1, the second-grade chips 7, the third-grade chips 8 and the fourth-grade chips 9) on the carrier board 2a" and eliminates the defective chips X, as shown in FIG. 2B' and FIG. 3'.

In step S33, the first picking device 21 generates the first status information according to the result of the picking (classification).

In an embodiment, the first picking device 21 transmits the first status information to the electronic device 3, so that the calculation module 23 can access the first status information, as shown in FIG. 3'.

In step S34, the second status information is collected by the calculation module 23.

In an embodiment, the second picking device 22 transmits the second wafer 2b' that has undergone the quality classification as the second status information (as shown in FIG. 2C) to the electronic device 3, as shown in FIG. 3', so that the calculation module 23 can access the second status information.

In step S35, the target information is generated by the calculation module 23.

In an embodiment, the calculation module 23 performs optimized matching according to the first status information and the second status information to obtain the target information, as shown in FIG. 2D and FIG. 3'.

In step S36, the second picking device 22 is used to perform the second picking and placing operation.

Figure 2E:
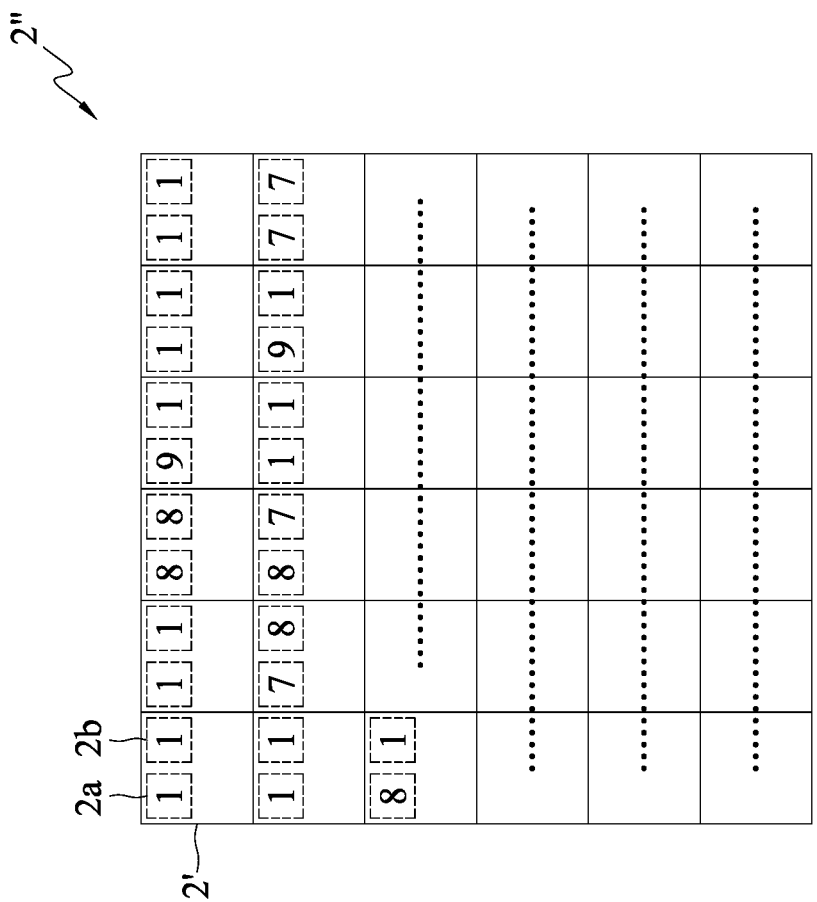
FIG. 2E is a schematic top plane view of a full-surface package structure manufactured by the production line of the chip matching system of the present disclosure.

In an embodiment, the second picking device 22 selects the good chips on the second wafer 2b' (the first-grade chips 1, the second-grade chips 7 and the third-grade chips 8 as shown in FIG. 2C) according to the instructions of the target information of the calculation module 23 as the second electronic components 2b, wherein the second electronic components 2b are respectively moved onto the corresponding carrier boards 2a", as shown in FIG. 2E and FIG. 3'.

Therefore, the first picking device 21 and the second picking device 22 transmit the required first status information and second status information to the calculation module 23, so that the calculation module 23 can perform the grade matching between the first electronic components 2a and the second electronic components 2b to generate the target information, so that the first picking device 21 and the second picking device 22 can integrate the first electronic components 2a and the second electronic components 2b in one position according to the target information. Therefore, in the packaging process of a multi-chip module (such as the electronic package 2'), chip matching of higher grades can be performed according to the quality requirements of the electronic packages 2', thus the matching efficiency of chip qualities of the electronic packages 2' can be accelerated, and the quality of the electronic packages 2' can be optimized, so as to improve the production capacity and efficiency of the production line.

Figure 4:
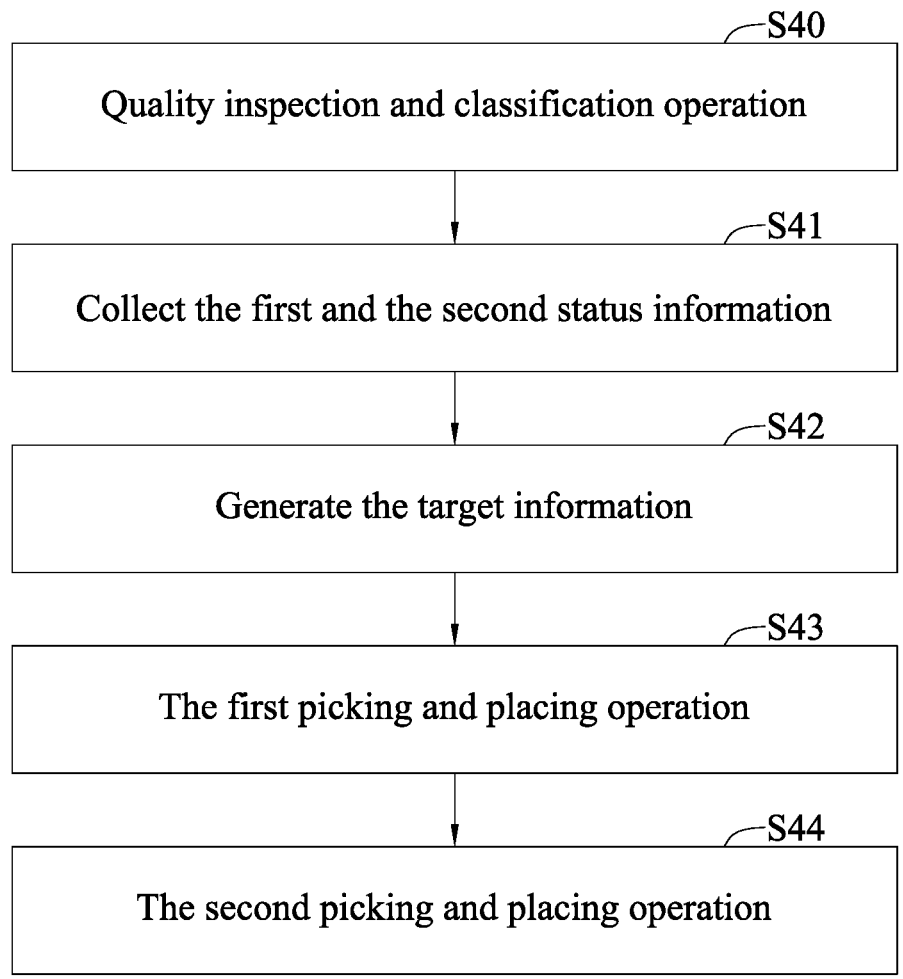
FIG. 4 is a flow block diagram of the second embodiment of the chip matching method of the present disclosure.
Figure 4:
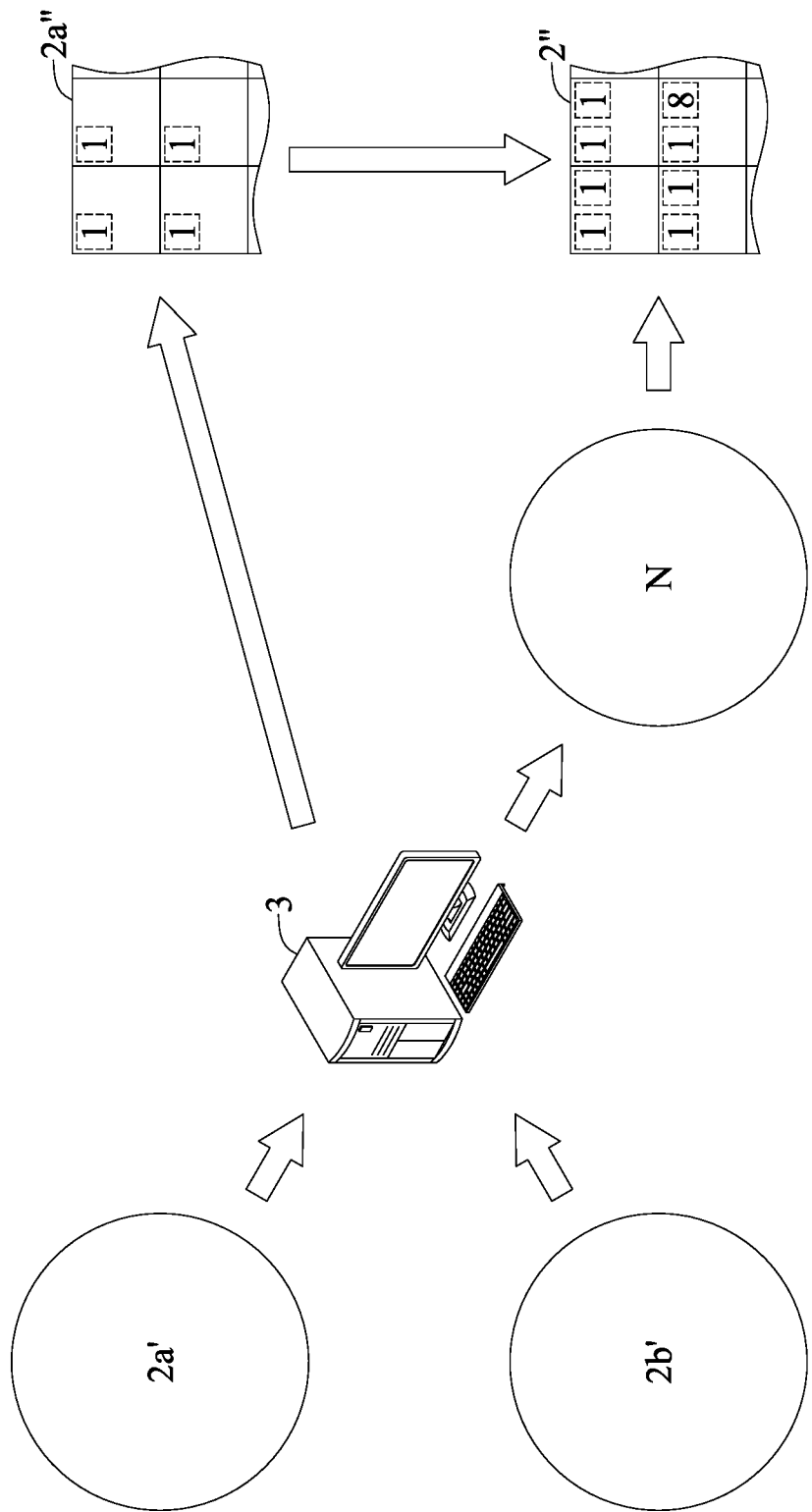

FIG. 4 is a schematic block diagram of the flow of the second embodiment of the chip matching method of the present disclosure. The difference between this embodiment and the first embodiment lies in the way of generating the first status information, and the other steps are substantially the same, so the same parts will not be repeated below.

In step S40, the first wafer 2a' and the second wafer 2b' are provided on a production line for manufacturing the electronic package 2' as shown in FIG. 2A', so that the quality inspection and classification operation of the first wafer 2a' and the second wafer 2b' are performed by the first detection device 20a and the second detection device 20b.

In an embodiment, the first detection device 20a performs quality inspection on each chip defined in the first wafer 2a' to determine good chips and defective chips X, and then classifies the quality of functionality performance of each good chip to define the first-grade chips 1, the second-grade chips 7, the third-grade chips 8 and the fourth-grade chips 9, as shown in FIG. 4'.

Moreover, the second detection device 20b performs quality inspection on each chip defined in the second wafer 2b' to determine good chips and defective chips X, and then classifies the quality of functionality performance of each good chip to define the first-grade chips 1, the second-grade chips 7 and the third-grade chips 8, as shown in FIG. 4'.

In step S41, the calculation module 23 collects the first status information and the second status information, as shown in FIG. 4'.

In an embodiment, the first picking device 21 transmits the first wafer 2a' that has undergone quality classification as the first status information (as shown in FIG. 2B) to the electronic device 3, as shown in FIG. 4', so that the calculation module 23 can access the first status information, and the second picking device 22 transmits the second wafer 2b' that has undergone quality classification as the second status information (as shown in FIG. 2C) to the electronic device 3, as shown in FIG. 4', so that the calculation module 23 can access the second status information.

In step S42, the target information is generated by the calculation module 23, as shown in FIG. 4'.

In an embodiment, the calculation module 23 performs the optimized matching according to the first status information and the second status information to obtain the target information.

In step S43, the first picking device 21 is used to perform the first picking and placing operation, as shown in FIG. 4'.

In an embodiment, the first picking device 21 picks the good chips on the first wafer 2a' (the first-grade chips 1, the second-grade chips 7, the third-grade chips 8, and the fourth-grade chips 9) according to the instructions of the target information of the calculation module 23 and rearranges the good chips on the carrier board 2a", and eliminates the defective chips X. For example, the first picking device 21 does not follow the sequence of the continuous winding path L, but rearranges the good chips on the first wafer 2a' (the first-grade chips 1, the second-grade chips 7, the third-grade chips 8 and the fourth-grade chips 9) according to the arrangement of grade positions of the target information (such as the arrangement on the carrier board 2a" shown in FIG. 4").

In step S44, the second picking device 22 is used to perform the second picking and placing operation, as shown in FIG. 4'.

In an embodiment, the second picking device 22 selects the good chips on the second wafer 2b' (the first-grade chips 1, the second-grade chips 7 and the third-grade chips 8 as shown in FIG. 2C) according to the instructions of the target information of the calculation module 23 as the second electronic components 2b and moves the second electronic components 2b respectively onto the corresponding carrier boards 2a".

In summary, in the chip matching system 2 and the chip matching method of the present disclosure, the calculation module 23 is used to match the chips of different grades on multiple wafers to dispose multiple higher-grade electronic components (such as the first-grade chips 1) in the same electronic package 2', so that there will not be too many electronic components of the lowest grade (such as the third-grade chips 8 or the fourth-grade chips 9) in the electronic package 2'. Therefore, compared to the conventional technology, the chip matching system 2 of the present disclosure can effectively control the grades of various electronic components (such as the first electronic component 2a and the second electronic component 2b) in a single multi-chip module through the chip matching method, so that the function status of each multi-chip module (as shown in FIG. 2E) can be effectively controlled, so the subsequent quality control operations do not need to eliminate multi-chip modules with poor function status.

Figure 5:
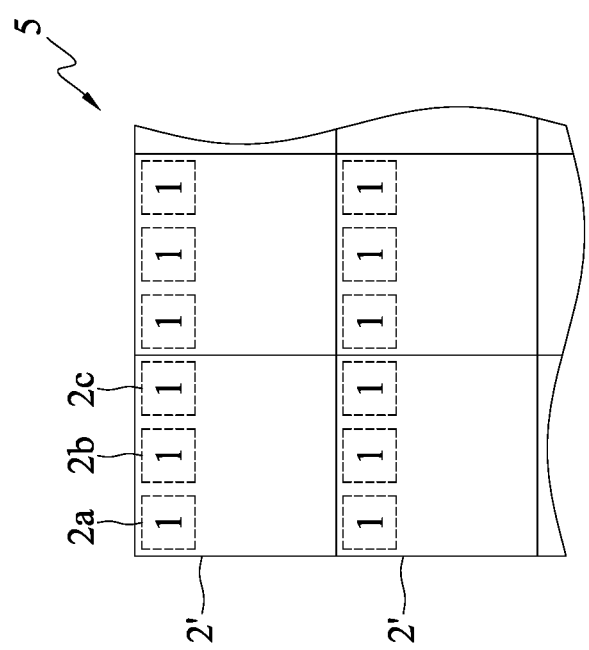
FIG. 5 is another aspect of FIG. 2E.

It should be understood that the chip matching system 2 and the chip matching method of the present disclosure are applicable to the matching among three or more wafers. For example, the matching can be performed on a wafer with the third electronic components 2c shown in FIG. 2A' to produce the full-surface package structure 5 shown in FIG. 5.

The aforementioned embodiments illustrate the principles and effects of the present disclosure, and are not used to limit the present disclosure. Persons having ordinary skills in the art can modify and change the aforementioned embodiments as long as the spirit and scope of the present disclosure are not violated. Therefore, the protection scope of the present disclosure should be as listed in the claims below.

What is claimed is:

1. A chip matching method, comprising:
  detecting a plurality of first electronic components by a first detection device, wherein at least two of the plurality of first electronic components have different grades from each other;
  detecting a plurality of second electronic components by a second detection device, wherein at least two of the plurality of second electronic components have different grades from each other;
  performing a grade matching between the different grades of the plurality of first electronic components and the different grades of the plurality of second electronic components to generate target information by a calculation module;
  moving at least one of the first electronic components from a first wafer to a carrier board by a first picking device based on the target information; and
  moving at least one of the second electronic components from a second wafer to the carrier board by a second picking device based on the target information,
  wherein the first detection device transmits first status information of the detecting of the plurality of first electronic components to the first picking device via the calculation module and the second detection device transmits second status information of the detecting of the plurality of second electronic components to the second picking device via the calculation module.

2. The chip matching method according to claim 1, wherein three of the plurality of first electronic components are classified into first-grade, second-grade and third-grade, respectively.

3. The chip matching method according to claim 1, wherein three of the plurality of second electronic components are classified into first-grade, second-grade and third-grade, respectively.

4. The chip matching method according to claim 1, wherein the grades are defined into highest grade and worst grade based on quality of functionality performance, and the first electronic components with the highest grade among at least two of the plurality of first electronic components with different grades from each other are matched to the second electronic components with the highest grade among at least two of the plurality of second electronic components with different grades from each other in a same position of the carrier board.

5. The chip matching method according to claim 4, wherein a number of matched pairs of the first electronic components and the second electronic components of the highest grade is maximized.

* * * * *